United States Patent
Qu et al.

(10) Patent No.: US 6,858,094 B2
(45) Date of Patent: Feb. 22, 2005

(54) SILICON WAFER AND SILICON EPITAXIAL WAFER AND PRODUCTION METHODS THEREFOR

(75) Inventors: Wei Feig Qu, Gunma (JP); Yoshinori Hayamizu, Gunma (JP); Hiroshi Takeno, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 13 days.

(21) Appl. No.: 10/380,975
(22) PCT Filed: Sep. 14, 2001
(86) PCT No.: PCT/JP01/08006
§ 371 (c)(1), (2), (4) Date: Mar. 20, 2003
(87) PCT Pub. No.: WO02/25717
PCT Pub. Date: Mar. 28, 2002

(65) Prior Publication Data
US 2004/0005777 A1 Jan. 8, 2004

(30) Foreign Application Priority Data
Sep. 20, 2000 (JP) .......................................... 2000-286054

(51) Int. Cl.[7] .............................................. H01L 29/06
(52) U.S. Cl. ...................................... 148/33.5; 438/476
(58) Field of Search ................................. 438/143, 471, 438/476; 148/33.3, 33.5

(56) References Cited

U.S. PATENT DOCUMENTS

| 5,110,404 A | * | 5/1992 | Fusegawa et al. ........... 438/471 |
| 5,286,658 A | * | 2/1994 | Shirakawa et al. .......... 438/471 |
| 5,961,713 A | * | 10/1999 | Wijaranakula .............. 438/142 |
| 6,197,606 B1 | * | 3/2001 | Polignano et al. ............ 438/17 |

FOREIGN PATENT DOCUMENTS

| JP | 58-056344 | 4/1983 |
| JP | 62-202528 | 9/1987 |
| JP | 63-090141 | 4/1988 |
| JP | 02-263792 | 10/1990 |
| JP | 03-185831 | 8/1991 |
| JP | 04-069937 | 3/1992 |
| JP | 05-058788 | 3/1993 |
| JP | 05-102167 | 4/1993 |
| JP | 06-310517 | 11/1994 |
| JP | 08-298233 | 11/1996 |
| WO | WO 00/55397 | 9/2000 |

* cited by examiner

*Primary Examiner*—Chandra Chaudhari
(74) *Attorney, Agent, or Firm*—Hogan & Hartson, LLP

(57) ABSTRACT

The present invention provides a silicon wafer having a DZ layer near a surface and an oxide precipitate layer in a bulk portion, wherein interstitial oxygen concentrations of the DZ layer, the oxide precipitate layer and a transition region between the DZ layer and the oxide precipitate layer are all 8 ppma or less, and an epitaxial silicon wafer, wherein an epitaxial layer is formed on a surface of the silicon wafer, as well as a method for producing a silicon wafer, which comprises growing a silicon single crystal ingot having an initial interstitial oxygen concentration of 10 to 25 ppma by the Czochralski method, processing the silicon single crystal ingot into a wafer, and subjecting the wafer to a first heat treatment at 950 to 1050° C. for 2 to 5 hours, a second heat treatment at 450 to 550° C. for 4 to 10 hours, a third heat treatment at 750 to 850° C. for 2 to 8 hours, and a fourth heat treatment at 950 to 1100° C. for 8 to 24 hours. Thus, there is provided a method for producing a silicon wafer of which high resistivity can surely be maintained even when the wafer is subjected to a heat treatment for device production.

14 Claims, 3 Drawing Sheets

SILICON WAFER AND SILICON EPITAXIAL WAFER AND PRODUCTION METHODS THEREFOR

TECHNICAL FIELD

The present invention relates to a technique by which a DZ-IG silicon wafer having high resistivity and also having high gettering ability can surely be obtained.

BACKGROUND ART

Silicon wafers of high resistivity produced by the floating zone method (FZ method) have conventionally been used for power devices such as high-voltage power devices and thyristors. However, it is difficult to produce a silicon wafer having a large diameter of 200 mm or more by the FZ method, and the radial resistivity distribution of usual FZ wafers is inferior to that of CZ wafers. Therefore, silicon wafers produced by the CZ method will be promising in the future, because wafers of excellent radial resistivity distribution can be produced by the CZ method, and in addition, wafers of a large size having a diameter of 200 mm or more can sufficiently be produced by the method.

In recent years, in particular, reduction of parasitic capacity is required in semiconductor devices for mobile communications and the latest C-MOS devices. For this reason, a silicon wafer of high resistivity and a large diameter comes to be needed. Moreover, the effect of using a high resistivity substrate on reduction of transmission loss of signals and parasitic capacity in Schottky barrier diodes has been reported. Furthermore, although the so-called SOI (Silicon On Insulator) wafer may be used in order to obtain further higher performance of the aforementioned semiconductor devices, it is required to use a wafer of high resistivity produced by the CZ method as a base wafer even when semiconductor devices are produced by using the SOI wafer in order to obtain a large diameter of wafer or solve the problem of transmission loss of signals or the like.

However, since the CZ method utilizes a crucible made of quartz, not a small amount of oxygen (interstitial oxygen) is introduced into a silicon crystal. Although each of such oxygen atoms is usually electrically neutral, if they are subjected to a heat treatment at a low temperature of around 350 to 500° C., a plurality of them gather to release electrons and become electrically active oxygen donors. Therefore, if a wafer obtained by the CZ method is subsequently subjected to a heat treatment at about 350 to 500° C. in the device production process and so forth, there arises a problem that resistivity of a high resistivity CZ wafer is reduced due to the formation of the oxygen donors.

In order to prevent the resistivity reduction due to the above oxygen donors and obtain a silicon wafer of high resistivity, methods for producing a silicon single crystal having a low interstitial oxygen concentration from an initial stage of the crystal growth by the magnetic field-applied CZ method (MCZ method) were proposed (refer to Japanese Patent Publication (Kokoku) No. 8-10695 and Japanese Patent Laid-open Publication (Kokai) No. 5-58788). Further, there has also been proposed a method conversely utilizing the phenomenon of the oxygen donor formation, wherein a P-type silicon wafer of a low impurity concentration and low oxygen concentration is subjected to a heat treatment at 400 to 500° C. to generate oxygen donors, and P-type impurities in the P-type silicon wafer is compensated by these oxygen donors so that the wafer should be converted into N-type to produce an N-type silicon wafer of high resistivity (refer to Japanese Patent Publication No. 8-10695).

However, a silicon single crystals of a low interstitial oxygen concentration produced by the MCZ method or the like as mentioned above suffers from a drawback that the density of bulk defects generated by a heat treatment in the device production process becomes low, and thus sufficient gettering effect will be unlikely to be obtained. In devices of a high integration degree, it is essential to impart gettering effect by a certain amount of oxygen precipitation.

Further, the method of obtaining a silicon wafer of N-type by generating oxygen donors by a heat treatment and compensating P-type impurities in the wafer to convert it into N-type is a complicated method that requires a heat treatment for a long period of time. Moreover, this method cannot provide a P-type silicon wafer. In addition, this method also has a drawback that resistivity of wafers obtained by this method may vary depending on the subsequent heat treatment. Furthermore, in this method, in case of high interstitial oxygen concentration, it becomes difficult to control the wafer resistivity. Therefore, this method suffers from a drawback that a low initial concentration of interstitial oxygen in a silicon wafer must be used, and thus the gettering effect of the wafer becomes low.

In order to solve these problems, the applicants of the present application proposed, in a previous application (Japanese Patent Application No. 11-241370), a method for producing a silicon wafer, which comprises growing a silicon single crystal ingot having a resistivity of 100 Ω·cm or more and an initial interstitial oxygen concentration of 10 to 25 ppma (JEIDA: Japan Electronic Industry Development Association) by the Czochralski method, processing the silicon single crystal ingot into a wafer, and subjecting the wafer to an oxygen precipitation heat treatment so that the residual interstitial oxygen concentration in the wafer should become 8 ppma or less. According to this method, a CZ wafer of high resistivity of which resistivity is unlikely to decrease even when the wafer is subjected to a heat treatment for device production. Therefore, if this wafer is used as, for example, a base wafer of SOI wafer, devices of extremely high performance for mobile communications can be obtained.

On the other hand, it is considered that, in order to realize a wafer having performance of the same level as the SOI wafer by using a bulk wafer, of which production cost is more inexpensive compared with SOI wafer, so to speak "high resistivity DZ-IG wafer" of a structure having a DZ layer (Denuded Zone layer) sufficiently made defect free on a surface of such a high resistivity CZ wafer is required. Although there has conventionally been the so-called DZ-IG wafer, which is obtained by subjecting a CZ silicon wafer having usual resistivity to a DZ-IG (Intrinsic Gettering) treatment, there has not been conceived to apply this technique to a high resistivity CZ wafer at all. Therefore, the applicant of the present application also disclosed a method for obtaining a high resistivity DZ-IG wafer by the aforementioned heat treatment that makes interstitial oxygen concentration 8 or less ppma in the previous application (Japanese Patent Application No. 11-241370).

As the DZ-IG treatment applied to a wafer of usual resistivity, a three-step heat treatment is generally used. Supersaturated oxygens in the vicinity of a wafer surface are out-diffused by a first step high temperature heat treatment at 1100° C. or higher, a low temperature heat treatment around 650° C. is performed as a second step heat treatment to form oxygen precipitation nuclei, and a moderate temperature heat treatment is performed at about 1000° C. as the third step heat treatment to allow growth of the oxide precipitates. By such a three-step heat treatment, an oxide precipitate region is formed in the wafer, and thus a DZ layer in which oxide precipitates do not exist is formed in the vicinity of a surface of the front side or back side.

Therefore, the applicants of the present application applied the same heat treatment as the above heat treatment as the heat treatment for obtaining the interstitial oxygen concentration of 8 or less ppma. As a result, it was found that a high resistivity DZ-IG wafer having a high resistivity of 100 Ω·cm or more and having a DZ layer free from crystal defects near the surface and an oxide precipitate layer in which oxide precipitates are sufficiently precipitated could be obtained.

It was considered that such a high resistivity DZ-IG wafer could sufficiently serve as an alternative of SOI wafers for mobile communications. However, subsequent investigations revealed that, if such a DZ-IG wafer was subjected to a heat treatment during the device production process, the resistivity near the wafer surface was extremely reduced as the case may be, and thus sufficient high resistivity may not be obtained.

DISCLOSURE OF THE INVENTION

The present invention was accomplished in order to solve these problems, and its object is to provide a method for producing a silicon wafer of which high resistivity can surely be maintained even when the wafer is subjected to a heat treatment for device production, and thus surely provides a high resistivity DZ-IG wafer that can serve as an alternative of SOI wafer for mobile communications.

In order to achieve the aforementioned object, the present invention provides a silicon wafer having a DZ layer near a surface and an oxide precipitate layer in a bulk portion, wherein interstitial oxygen concentrations of the DZ layer, the oxide precipitate layer and a transition region between the DZ layer and the oxide precipitate layer are all 8 ppma or less.

The silicon wafer described above in which the interstitial oxygen concentration is 8 ppma (JEIDA: Japan Electronic Industry Development Association) or less even in the transition region between the DZ layer and the oxide precipitate layer in addition to the DZ layer and the oxide precipitate layer is substantially perfectly free from the problems of the reduction and fluctuation of resistivity due to the interstitial oxygen acting as donor, and thus it can be a DZ-IG wafer of which high resistivity can surely be maintained even after it is subjected to a heat treatment.

In the aforementioned wafer, the transition region between the DZ layer and the oxide precipitate layer preferably has a width of 5 μm or less.

If the transition region between the DZ layer and the oxide precipitate layer has a narrow width of 5 μm or less as described above, the reduction and fluctuation of resistivity due to the interstitial oxygen acting as donor become more unlikely to occur, and thus the wafer can be a DZ-IG wafer that can more surely maintain high resistivity.

In the present invention, resistivity of the silicon wafer can be 100 Ω·cm or more.

Although the silicon wafer of the present invention shows the advantage that formation of the oxygen donor in the wafer by a heat treatment for device production is suppressed and thus resistivity of the wafer does not fluctuate even if the wafer is a wafer of usual resistivity, the advantage becomes particularly remarkable for a high resistivity DZ-IG wafer having a resistivity of 100 Ω·cm or more.

Moreover, the present invention provides a silicon wafer having a DZ layer near a surface and an oxide precipitate layer in a bulk portion, wherein interstitial oxygen concentrations of the DZ layer and the oxide precipitate layer are both 8 ppma or less, and a transition region between the DZ layer and the oxide precipitate layer has a width of 5 μm or less.

If the transition region between the DZ layer and the oxide precipitate layer has a narrow width of 5 μm or less as described above, oxygen donners generated in the whole wafer becomes few, even if the precipitation does not sufficiently occur in the transition region and the region has a interstitial oxygen concentration larger than 8 ppma. Therefore, the reduction of resistivity due to the oxygen donner becomes quite little to such a degree that it should not cause any problem. Thus, the wafer can be a high resistivity DZ-IG wafer.

The present invention further provides an epitaxial silicon wafer, wherein an epitaxial layer is formed on a surface of the silicon wafer of the present invention.

The epitaxial silicon wafer wherein an epitaxial layer is formed on the surface of the silicon wafer of the present invention can be a wafer that can be suitably used as, for example, an alternative of an SOI wafer for mobile communications.

Further, the present invention further provides a method for producing a silicon wafer, which comprises growing a silicon single crystal ingot having an initial interstitial oxygen concentration of 10 to 25 ppma by the Czochralski method, processing the silicon single crystal ingot into a wafer, and subjecting the wafer to a first heat treatment at 950 to 1050° C. for 2 to 5 hours, a second heat treatment at 450 to 550° C. for 4 to 10 hours, a third heat treatment at 750 to 850° C. for 2 to 8 hours, and a fourth heat treatment at 950 to 1100° C. for 8 to 24 hours.

If a silicon wafer is produced by performing heat treatments with such heat treatment conditions as described above, a silicon wafer in which interstitial oxygen concentrations of the DZ layer, the oxide precipitate layer and a transition region between the DZ layer and the oxide precipitate layer are all 8 ppma or less and the transition region has a narrow width of 5 μm or less can be produced, and thus a wafer not showing reduction and fluctuation of resistivity due to influence of oxygen donors can be obtained, even if the wafer has high resistivity.

In the aforementioned method, the silicon single crystal ingot may be grown so that the ingot should have a resistivity of 100 Ω·cm or more.

If a silicon wafer is produced as described above, a high resistivity DZ-IG wafer having a resistivity of 100 Ω·cm can surely be produced.

The present invention further provides a method for producing an epitaxial silicon wafer, which comprises forming an epitaxial layer on a surface of a silicon wafer produced by the method for producing a silicon wafer of the present invention.

If an epitaxial wafer is produced by forming an epitaxial layer on a silicon wafer produced by the method for producing a silicon wafer of the present invention as described above, a wafer that can be suitably used as, for example, an alternative of an SOI wafer for mobile communications can be easily produced.

As explained above, according to the present invention, there can be obtained a CZ wafer in which fluctuation of resistivity due to interstitial oxygen acting as donor is suppressed even after the wafer is subjected to a heat treatment for device production. This advantage is extremely effective for a high resistivity CZ wafer having a resistivity of 100 Ω·cm or more, and it enables the wafer to be used as an alternative of an SOI wafer for mobile communications. Moreover, if an epitaxial layer is formed on the surface of the wafer, there can be obtained an epitaxial wafer that is suitably used as alternative of the SOI wafer because of superior characteristics thereof.

BEST MODE FOR CARRYING OUT THE INVENTION

Figure 1:
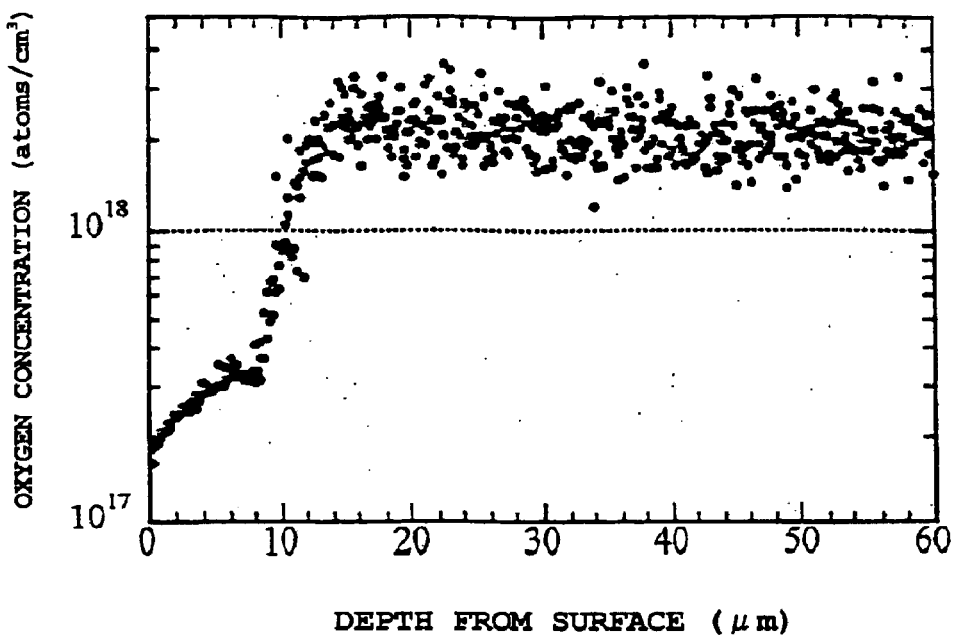
FIG. 1 is a graph showing relationship between the depth from surface and the absolute value of oxygen concentration in a silicon wafer of the present invention.

Hereafter, the present invention will be explained in detail.

As described above, in order to obtain a "high resistivity DZ-IG wafer" that can realize, as a bulk wafer, performance at a level equivalent to that of an SOI wafer for mobile communications utilizing a high resistivity wafer as the base wafer, the inventors of the present invention applied a three-step heat treatment usually performed as a heat treatment for obtaining an interstitial oxygen concentration of 8 ppma or less to a CZ silicon wafer of high resistivity, especially a wafer having a resistivity of 100 Ω·cm or more as a trial.

As a result, in the wafer immediately after the three-step heat treatment, a DZ layer was formed in the vicinity of the wafer surface while the high resistivity was maintained, and an IG layer (oxide precipitate region) was formed in the bulk portion. Therefore, a desired high resistivity DZ-IG wafer was obtained. However, when a heat treatment simulating a device production heat treatment was applied to this wafer, it was found that the resistivity near the wafer surface might extremely decrease.

It was expected that the resistivity decrease was caused due to interstitial oxygen existing much somewhere in the wafer and acting as donors. Therefore, the inventors of the present invention measured and examined distribution of interstitial oxygen concentration along the depth direction in a wafer after the heat treatment in which the resistivity is decreased by using a secondary ion mass spectroscopy (SIMS) apparatus. According to SIMS, the oxygen concentration is detected to be a higher value than that of the interstitial oxygen in a region in which oxide precipitates are formed, because both of interstitial oxygen and oxide precipitates are measured, whereas the oxygen concentration is detected to be a value equivalent to the concentration of interstitial oxygen in a region where no oxide precipitate is present such as a DZ layer. As a result it was found that the interstitial oxygen concentration in a DZ layer gradually increased from the surface to the inside thereof, the interstitial oxygen concentration exceeded 8 ppma ($4 \times 10^{17}$ atoms/cm$^3$) in the transition region in which the DZ layer does not reach to the oxide precipitate region (a region that does not fully become a DZ layer, in which a few oxide precipitates exist), and a region around the transition region corresponded to a region in which resistivity was extremely decreased after the heat treatment simulating a device production heat treatment.

That is, it is considered that, even if the interstitial oxygen concentration becomes sufficiently low in the DZ layer near the surface and the bulk portion since the interstitial oxygen is out-diffused in the DZ layer and precipitates as oxide precipitates in the bulk portion, the interstitial oxygen concentration is still high in the transition region between them even after the three-step heat treatment, and therefore the resistivity is decreased by oxygen acting as donor.

Therefore, it was expected that, for the purpose of surely obtaining a high resistivity DZ-IG wafer, if the interstitial oxygen concentration of not only the DZ layer and the oxide precipitate layer but also the transition region between the both can be made to be 8 ppma or less, the decrease of resistivity due to oxygen acting as donor could be prevented even after a heat treatment used as a device production heat treatment.

Moreover, it was considered that, if the aforementioned transition region could be made to have a profile as narrow and sharp as possible, the amount of interstitial oxygen as the whole transition region would become small, and thus the influence of oxygen acting as donor could also be made small.

The present invention was accomplished as a result of various investigations about heat treatment conditions for obtaining such a profile.

The present inventions will be further explained hereafter. However, the present invention is not limited by these explanations.

First, a silicon single crystal ingot is pulled by the known CZ method or the known MCZ method where a single crystal is pulled while a magnetic field is applied to a melt in the CZ method to control convection of the silicon melt, so that the silicon single crystal ingot should have a desired high resistivity of 100 Ω·cm or more and an initial interstitial oxygen concentration of 10 to 25 ppma. These pulling methods are methods comprising bringing a seed crystal into contact with a melt of polycrystalline silicon raw material contained in a quartz crucible and slowly pulling the seed crystal with rotation to allow growth of a single crystal ingot of a desired diameter. A desired initial interstitial oxygen concentration can be obtained by using conventional techniques. For example, a crystal having a desired oxygen concentration can be obtained by suitably adjusting parameters such as rotational speed of the crucible, flow rate of introduced gas, atmospheric pressure, temperature distribution and convection of silicon melt and strength of the magnetic field to be applied.

The CZ silicon single crystal ingot obtained as described above is sliced by using a cutting machine such as a wire saw or inner diameter slicer, and subjected to steps of chamfering, lapping, etching, polishing and so forth to be processed into CZ silicon single crystal wafers according to conventional techniques. Of course, these steps are mere examples, and there may be used various other steps such as cleaning step and heat treatment step. Further, the steps are used with suitable modification including the alteration of the order of steps, omission of some steps and so forth according to purpose.

Then, the CZ silicon single crystal wafer is subjected to the following four-step heat treatment according to the present invention.

(First step heat treatment) 950 to 1050° C., 2 to 5 hours

It was found that, if the heat treatment of the first step was performed at a temperature slightly lower than that of the first step of the heat treatment of the conventional three-step heat treatment as mentioned above, the oxygen concentration near the wafer surface could be made sufficiently low, and the interstitial oxygen concentration profile of the transition region could be made sharp. With a heat treatment at a temperature lower than the above-defined range or for a period shorter than the above-defined range, a sufficient DZ layer is not formed. Further, with a heat treatment at a temperature higher than the above-defined range or for a period longer than the above-defined range, the transition region hardly has a sharp profile.

(Second step heat treatment) 450 to 550° C., 4 to 10 hours

By using a nucleus formation temperature lower than the conventional temperature to form precipitation nuclei at low temperature as mentioned above, the oxygen precipitation in the bulk portion caused by a subsequent heat treatment becomes likely to advance even with a relatively low initial oxygen concentration, and as a result, the residual interstitial oxygen concentration can be lowered. With a heat treatment at a temperature lower than the above-defined range or for a period shorter than the above-defined range, sufficient nucleus formation cannot be attained.

(Third step heat treatment) 750 to 850° C., 2 to 8 hours

In order to prevent the fine precipitation nuclei generated in the previous heat treatment from being disappeared by a subsequent heat treatment, a heat treatment in the above temperature range is performed to grow the oxygen precipitation nuclei. At a temperature higher than the above-defined range, it becomes likely that the precipitation nuclei are melted again. At a temperature lower than the above-defined range or with a period shorter than the above-defined range, sufficient nucleus formation cannot be attained.

(Fourth step heat treatment) 950 to 1100° C., 8 to 24 hours

By growing oxide precipitates by this heat treatment, sufficient IG ability can be obtained, and slip dislocation resistance is also improved. At a temperature higher than the above-defined range, the precipitation nuclei grown by the previous heat treatment may be melted again. At a temperature lower than the above-defined range or with a period shorter than the above-defined range, growth of the precipitates becomes insufficient, and thus it becomes difficult to obtain the desired IG ability.

The heat treatment atmosphere for these heat treatments is not particularly limited, and usually used nitrogen atmosphere, a nitrogen atmosphere containing a small amount of oxygen, an oxidizing atmosphere and so forth may be used. However, in order to actively out-diffuse supersaturated oxygen in the vicinity of the wafer surface, a non-oxidizing atmosphere is preferred.

By performing such heat treatments as described above, the interstitial oxygen concentration can be made to be a low interstitial oxygen concentration of 8 ppma or less in all of the DZ layer, the oxide precipitate layer and the transition region, and moreover, the width of the transition region can be made to be 5 $\mu$m or less. Therefore, the absolute amount of the interstitial oxygen in that region can be made small. Accordingly, there can be obtained a CZ silicon wafer of high resistivity of 100 $\Omega$·cm or more, which is not substantially affected by residual interstitial oxygen acting as donner even if the wafer is subjected to the device production process.

Furthermore, if an epitaxial wafer is produced by forming an epitaxial layer on such a silicon wafer under desired conditions, it can be a wafer suitable as alternative of SOI wafer for mobile communications.

Moreover, even when the present invention is applied to a wafer of usual resistivity, there is of course also obtain the effect that the formation of oxygen donor by a device production heat treatment is suppressed, and therefore the resistivity does not fluctuate.

In addition, since the width of the transition region can be narrowed by the present invention, the concentration of the interstitial oxygen existing in the whole region can be reduced even if the interstitial oxygen concentration in that region exceeds 8 ppma, and as a result, resistivity of a portion near the wafer surface can be maintained to be high.

The present invention will be specifically explained hereafter with reference to the following example of the present invention and comparative example. However, the present invention is not limited by these.

EXAMPLE AND COMPARATIVE EXAMPLE

A silicon single crystal ingot was grown by the CZ method, which had a diameter of 150 mm, crystal orientation of <100>, conductivity type of P-type, resistivity of 2000 to 8000 $\Omega$·cm and initial interstitial oxygen concentration of 18.1 to 18.3 ppma (measured by the infrared absorption method, a value obtained by using the transformation coefficient defined by Japan Electronic Industry Development Association (JEIDA)), and sliced to prepare wafers. These wafers were subjected to the heat treatments represented in Table 1 mentioned below. The heat treatment of the comparative example was performed simulating a conventional three-step heat treatment (out-diffusion+ formation of precipitation nucleus+growth of precipitates), but the third step heat treatment for growing oxide precipitates was performed with divided two steps at 800° C. and 1000° C. for comparison with the four-step heat treatment of the example. As the heat treatment atmosphere, nitrogen atmosphere was used for the both cases.

TABLE 1

|  | Example | Comparative Example |
| --- | --- | --- |
| First step heat treatment | 1000° C., 4 hours | 1150° C., 4 hours |
| Second step heat treatment | 500° C., 6 hours | 650° C., 6 hours |
| Third step heat treatment | 800° C., 6 hours | 800° C., 6 hours |
| Fourth step heat treatment | 1000° C., 16 hours | 1000° C., 16 hours |

The oxygen concentration profiles along the depth direction in the wafers after the heat treatments were measured by SIMS. The measurement results are shown in FIG. 1 (Example) and FIG. 2 (Comparative Example).

Figure 3:
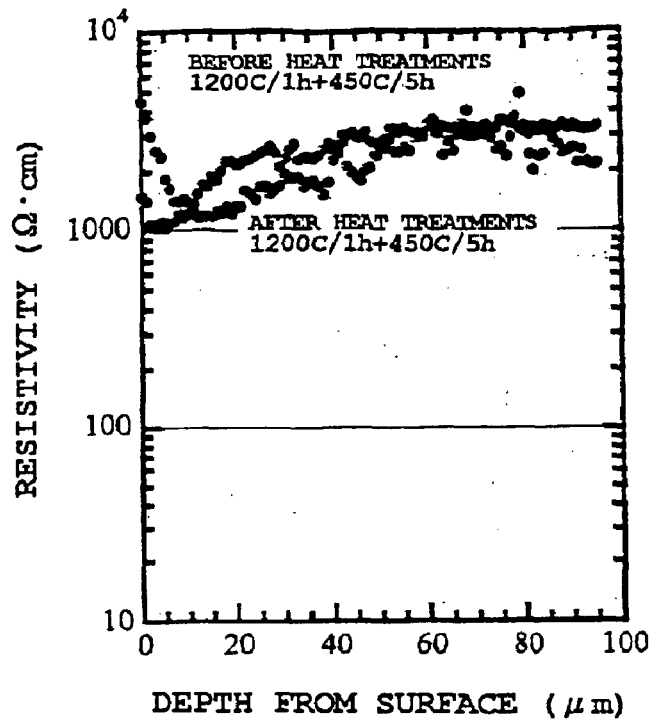
FIG. 3 is a graph showing relationship between the depth from surface and the resistivities before and after heat treatment in a silicon wafer of the present invention.
Figure 4:
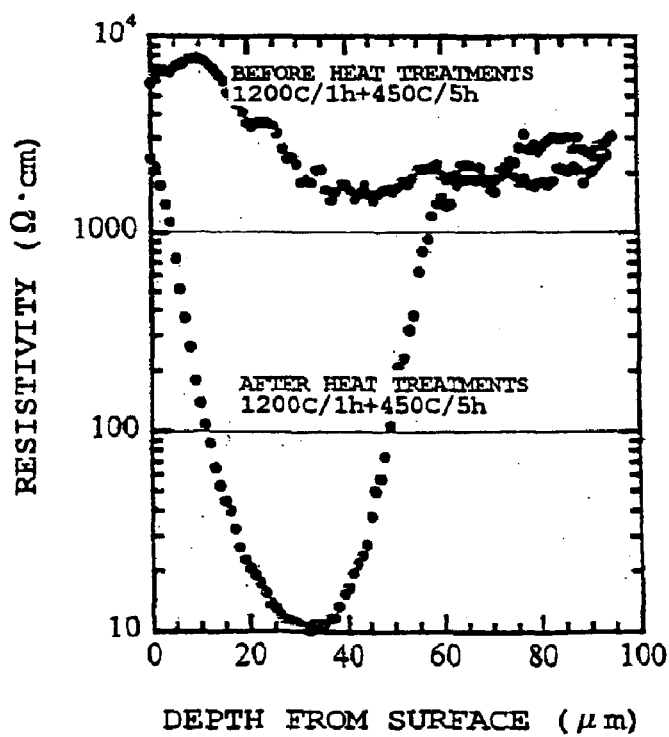
FIG. 4 is a graph showing relationship between the depth from surface and the resistivities before and after heat treatment in a conventional silicon wafer.

Then, the wafers were subjected to heat treatments at 1200° C. for 1 hour and at 450° C. for 5 hours simulating heat treatments for device production, and profiles of resistivity along the depth direction of these wafers were measured by the SR (Spreading Resistance) method. The results are shown in FIG. 3 (Example) and FIG. 4 (Comparative Example). Moreover, for comparison, the profiles of resistivity along the depth direction measured before the aforementioned heat treatments (measured by using other wafers) are also shown in FIGS. 3 and 4.

Figure 5:
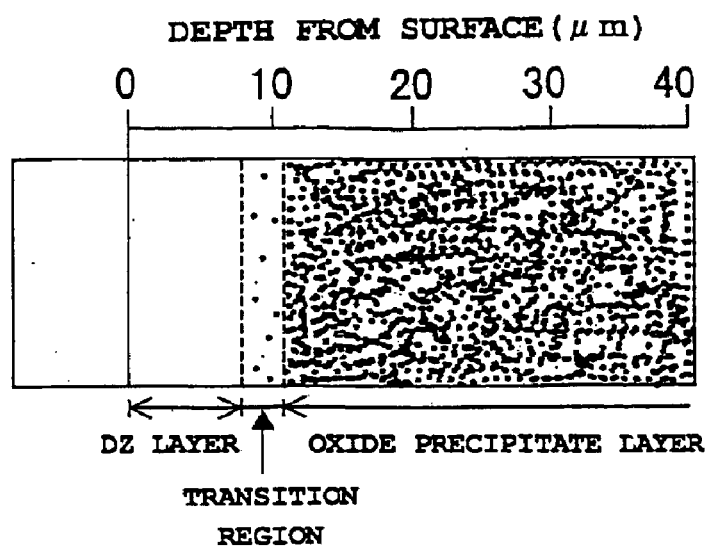
FIG. 5 is schematic view showing precipitate distribution along the depth direction in a silicon wafer of the present invention.

Furthermore, the wafers after the aforementioned heat treatments were subjected to angle polishing and then preferential etching to observe distribution of precipitates (etch pits) along the depth direction. Schematic views of the results are shown in FIG. 5 (Example) and FIG. 6 (Comparative Example).

The results shown in FIGS. 1 to 6 revealed as follows.

Figure 2:
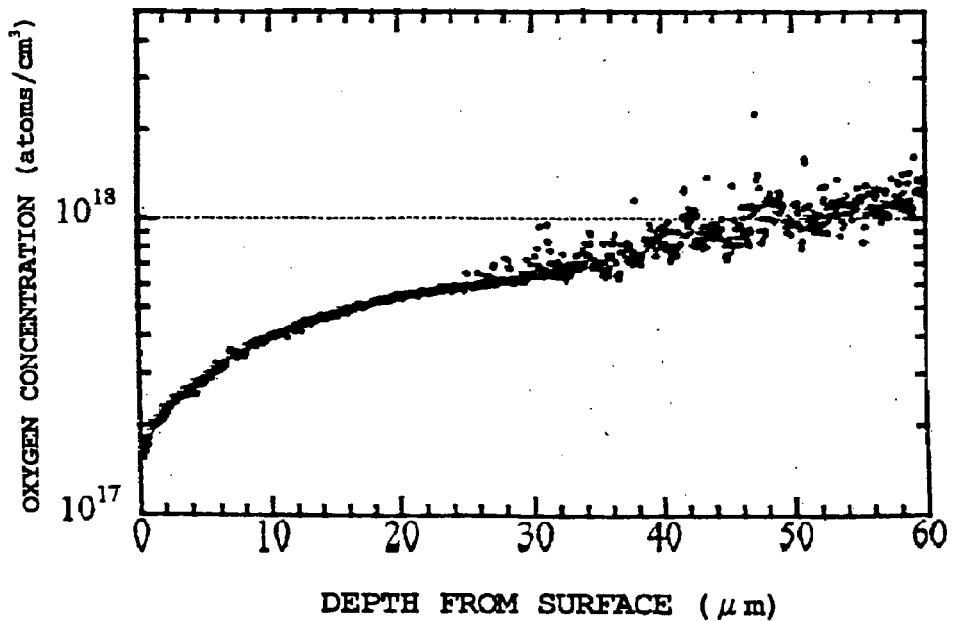
FIG. 2 is a graph showing relationship between the depth from surface and the absolute value of oxygen concentration in a conventional silicon wafer.

The ordinates of the graphs shown in FIGS. 1 and 2 represent absolute value of oxygen concentration measured by SIMS. In the both profiles, the measured values markedly vary when the depth from the surface exceeds a certain level, and this indicates that an oxide precipitate layer is formed from that depth. Therefore, the regions shallower than the oxide precipitate layers are DZ layers and transition regions, and based on comparison with the results shown in FIGS. 5 and 6, it can be seen that a region of about 8 μm from the surface is the DZ layer and a region of about 8 to 11 μm from the surface is the transition region in FIG. 1, and a region of about 20 μm from the surface is the DZ layer and a region of a depth of about 20 to 30 μm from the surface is the transition region in FIG. 2.

On the other hand, it can be seen that, in the resistivity distributions along the depth direction of the wafers shown in FIGS. 3 and 4, the wafer, had a high resistivity of 1000 Ω·cm or more irrespective of before or after the heat treatment and the position along the depth direction in FIG. 3, whereas the resistivity markedly decreased in a region of a depth of about 20 to 40 μm from the wafer surface in the wafer after the heat treatment in FIG. 4.

Figure 6:
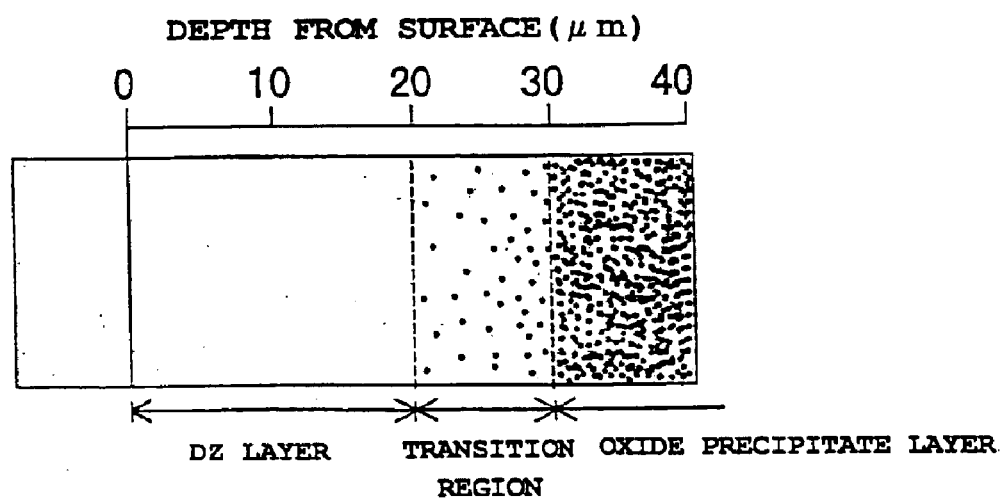
FIG. 6 is schematic view showing precipitate distribution along the depth direction in a conventional silicon wafer.

The portion in which resistivity is decreased in FIG. 4 is a portion overlapping the transition regions of FIGS. 2 and 6. When the interstitial oxygen concentration of the transition region (average in the transition region) was confirmed by the infrared absorption method, it was found that the region is a portion in which the concentration exceeded 8 ppma ($4 \times 10^{17}$ atoms/cm$^3$). Therefore, it is considered that, since there was a large amount of interstitial oxygen that became donor in this portion, and the width of the transition region was also thick, p-type was reversed to n-type, and in addition, resistivity decreased. The measurement of the interstitial oxygen concentration of the transition region by the infrared absorption method can be performed by using, for example, a measurement method using a bonded wafer obtained by bonding a surface of a wafer from which DZ layer is removed by polishing to an FZ wafer and then removing an oxide precipitate layer.

On the other hand, it is clear from FIG. 1 that, in the wafer of the example referred to in FIG. 1, the interstitial oxygen concentration of the DZ layer was 8 ppma or less. In addition, it was confirmed that the interstitial oxygen concentrations of the oxide precipitate layer and the transition region (residual interstitial oxygen) were also 8 ppma or less by the infrared absorption method. Therefore, in the wafer of the example referred to in FIG. 1, the interstitial oxygen concentration became 8 or less ppma in all of the DZ layer, the oxide precipitate layer and the transition region. Further, it is considered that, since the transition region had a narrow width of 5 μm or less, there was little influence of oxygen donor, and therefore resistivity reduction was not caused.

Moreover, an epitaxial layer of 3 μm was formed at 1125° C. on a high resistivity DZ-IG wafer produced under the same conditions as in the example. Since the epitaxial growth was carried out on the DZ layer, crystal defects were not observed in the epitaxial layer at all, and an epitaxial wafer of extremely high quality was obtained.

The present invention is not limited to the embodiments described above. The embodiments described above are mere examples, and those having the substantially same structure as that described in the appended claims and providing the similar functions and advantages are included in the scope of the present invention.

For example, the aforementioned embodiments were explained for the production of a DZ-IG silicon wafer having a high resistivity of 100 Ω·cm or more. However, the present invention is not limited to such embodiments, and even when it is applied to a DZ-IG wafer having a resistivity lower than the above, the advantage that resistivity does not fluctuate can be obtained, and such an application also falls within the scope of the present invention.

What is claimed is:

1. A silicon wafer having a DZ layer near a surface and an oxide precipitate layer in a bulk portion, wherein interstitial oxygen concentrations of the DZ layer, the oxide precipitate layer and a transition region between the DZ layer and the oxide precipitate layer are all 8 ppma or less.

2. The silicon wafer according to claim 1, wherein the transition region between the DZ layer and the oxide precipitate layer has a width of 5 μm or less.

3. The silicon wafer according to claim 1, wherein resistivity of the silicon wafer is 100 Ω·cm or more.

4. The silicon wafer according to claim 2, wherein resistivity of the silicon wafer is 100 Ω·cm or more.

5. A silicon wafer having a DZ layer near a surface and an oxide precipitate layer in a bulk portion, wherein interstitial oxygen concentrations of the DZ layer and the oxide precipitate layer are both 8 ppma or less, and a transition region between the DZ layer and the oxide precipitate layer has a width of 5 μm or less.

6. An epitaxial silicon wafer, wherein an epitaxial layer is formed on a surface of the silicon wafer according to any one of claim 1.

7. An epitaxial silicon wafer, wherein an epitaxial layer is formed on a surface of the silicon wafer according to any one of claim 2.

8. An epitaxial silicon wafer, wherein an epitaxial layer is formed on a surface of the silicon wafer according to any one of claim 3.

9. An epitaxial silicon wafer, wherein an epitaxial layer is formed on a surface of the silicon wafer according to any one of claim 4.

10. An epitaxial silicon wafer, wherein an epitaxial layer is formed on a surface of the silicon wafer according to any one of claim 5.

11. A method for producing a silicon wafer, which comprises growing a silicon single crystal ingot having an initial interstitial oxygen concentration of 10 to 25 ppma by the Czochralski method, processing the silicon single crystal ingot into a wafer, and subjecting the wafer to a first heat treatment at 950 to 1050° C. for 2 to 5 hours, a second heat treatment at 450 to 550° C. for 4 to 10 hours, a third heat treatment at 750 to 850° C. for 2 to 8 hours, and a fourth heat treatment at 950 to 1100° C. for 8 to 24 hours.

12. The method for producing a silicon wafer according to claim 11, wherein the silicon single crystal ingot is grown so that the ingot should have a resistivity of 100 Ω·cm or more.

13. A method for producing an epitaxial silicon wafer, which comprises forming an epitaxial layer on a surface of a silicon wafer produced by the method for producing a silicon wafer according to claim 11.

14. A method for producing an epitaxial silicon wafer, which comprises forming an epitaxial layer on a surface of a silicon wafer produced by the method for producing a silicon wafer according to claim 12.

* * * * *